(12) United States Patent
Cheng et al.

(10) Patent No.: US 9,754,941 B2
(45) Date of Patent: Sep. 5, 2017

(54) METHOD AND STRUCTURE TO FORM TENSILE STRAINED SIGE FINS AND COMPRESSIVE STRAINED SIGE FINS ON A SAME SUBSTRATE

(71) Applicant: GLOBALFOUNDRIES INC., Grand Cayman (KY)

(72) Inventors: Kangguo Cheng, Schenectady, NY (US); Ali Khakifirooz, Los Altos, CA (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/729,845

(22) Filed: Jun. 3, 2015

(65) Prior Publication Data

US 2016/0358922 A1   Dec. 8, 2016

(51) Int. Cl.
*H01L 21/18* (2006.01)
*H01L 27/092* (2006.01)
(Continued)

(52) U.S. Cl.
CPC .......... *H01L 27/0924* (2013.01); *H01L 21/18* (2013.01); *H01L 21/823807* (2013.01); *H01L 21/823821* (2013.01); *H01L 21/823864* (2013.01); *H01L 21/845* (2013.01); *H01L 27/1211* (2013.01); *H01L 29/161* (2013.01); *H01L 29/7842* (2013.01)

(58) Field of Classification Search
CPC ......... H01L 29/66795; H01L 21/02532; H01L 27/0924
See application file for complete search history.

(56) References Cited

U.S. PATENT DOCUMENTS

| 7,388,259 B2 | 6/2008 | Doris et al. |
| 7,674,669 B2 | 3/2010 | Hanafi |

(Continued)

OTHER PUBLICATIONS

Liow, T.-Y., et al., "Investigation of silicon-germanium fins fabricated using germanium condensation on vertical compliant structures," Applied Physics Letters, 2005, pp. 262104-1 to 262104-3, vol. 87, No. 26.

(Continued)

*Primary Examiner* — Marcos D Pizarro Crespo
*Assistant Examiner* — Shannon Yi
(74) *Attorney, Agent, or Firm* — Scully, Scott, Murphy & Presser, P.C.

(57) ABSTRACT

A method of forming a semiconductor structure that includes compressive strained silicon germanium alloy fins having a first germanium content and tensile strained silicon germanium alloy fins having a second germanium content that is less than the first germanium content is provided. The different strained and germanium content silicon germanium alloy fins are located on a same substrate. The method includes forming a cladding layer of silicon around a set of the silicon germanium alloy fins, and forming a cladding layer of a germanium containing material around another set of the silicon germanium alloy fins. Thermal mixing is then employed to form the different strained and germanium content silicon germanium alloy fins.

14 Claims, 5 Drawing Sheets

(51) Int. Cl.
*H01L 21/8238* (2006.01)
*H01L 21/84* (2006.01)
*H01L 29/78* (2006.01)
*H01L 27/12* (2006.01)
*H01L 29/161* (2006.01)

(56) References Cited

U.S. PATENT DOCUMENTS

| | | | |
|---|---|---|---|
| 7,993,999 | B2 | 8/2011 | Basker et al. |
| 8,183,627 | B2 | 5/2012 | Currie |
| 8,574,981 | B2 | 11/2013 | Flachowsky et al. |
| 2004/0169239 | A1* | 9/2004 | Rim ............... H01L 21/845 257/411 |
| 2011/0210393 | A1 | 9/2011 | Chen et al. |
| 2012/0104472 | A1 | 5/2012 | Xu et al. |
| 2012/0319211 | A1 | 12/2012 | van Dal et al. |
| 2015/0162248 | A1* | 6/2015 | Loubet ............ H01L 21/823431 438/425 |
| 2015/0194525 | A1* | 7/2015 | Xu .................... H01L 29/66795 257/192 |
| 2015/0279973 | A1* | 10/2015 | Akarvardar ......... H01L 29/1054 438/283 |
| 2015/0318354 | A1* | 11/2015 | Yin ....................... H01L 29/785 257/288 |
| 2016/0027876 | A1* | 1/2016 | Lee .................... H01L 29/1054 257/369 |
| 2016/0043225 | A1* | 2/2016 | Ching ................ H01L 29/1054 257/401 |

OTHER PUBLICATIONS

Cheng, K., et al., "Tall Strained High Percentage Silicon-Germanium Fins," U.S. Appl. No. 14/540,051, filed Nov. 13, 2014.

* cited by examiner

US 9,754,941 B2

METHOD AND STRUCTURE TO FORM TENSILE STRAINED SIGE FINS AND COMPRESSIVE STRAINED SIGE FINS ON A SAME SUBSTRATE

BACKGROUND

The present application relates to semiconductor devices, and more particularly to a method of forming a semiconductor structure that includes compressive strained silicon germanium alloy fins having a first germanium content and tensile strained silicon germanium alloy fins having a second germanium content that is less than the first germanium content on a same substrate.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs.

High percentage silicon germanium alloy fins (i.e., silicon germanium alloy fins having a germanium content of 50 atomic percent, %, or greater) are considered a front up option for future device nodes, like 7 nm and beyond. In order to achieve full advantage of high percentage silicon germanium alloy fins, the silicon germanium alloy fins must be strained. For CMOS devices, one needs tensile strained silicon germanium alloy fins for n-channel FETs (i.e., nFETs) and high percentage compressive strained silicon germanium alloy fins for p-channel FETs (i.e., pFETs), which are integrated on a same substrate. Applying strain solely through embedded stressor materials in the source region and the drain region does not work as desired, since the volume of the epitaxy in 10 nm and beyond technologies is too small to provide strain values needed to obtain desired performance targets.

In view of the above, there is still an ongoing need to provide tensile strained silicon germanium alloy fins and high percentage compressive strained silicon germanium alloy fins, which are integrated on a same substrate.

SUMMARY

The present application provides a method of forming a semiconductor structure that includes compressive strained silicon germanium alloy fins having a first germanium content and tensile strained silicon germanium alloy fins having a second germanium content that is less than the first germanium content. The different strained and germanium content silicon germanium alloy fins are located on a same substrate. The tensile strained silicon germanium alloy fins can be used for fabricating n-channel FET (i.e., nFET) devices, while the compressive strained silicon germanium alloy fins having the higher germanium content can be used for fabricating p-channel FET (i.e., pFET) devices.

In one aspect of the present application, a method of forming a semiconductor structure is provided. In accordance with an embodiment of the present application, the method may include providing a plurality of silicon germanium alloy fins extending upwards from a surface of a substrate. A germanium containing layer is formed contacting exposed surfaces of each silicon germanium alloy fin of a first set of the silicon germanium alloy fins, and a silicon layer is formed contacting exposed surfaces of each silicon germanium alloy fin of a second set of the silicon germanium alloy fins. The aforementioned formations may occur in any order. Next, the first set of the silicon germanium alloy fins containing the germanium containing layer is converted into compressive strained silicon germanium alloy fins having a first germanium content, while also converting the second set of the silicon germanium alloy fins containing the silicon layer into tensile strained silicon germanium alloy fins having a second germanium content that is less than the first germanium content.

In another aspect of the present application, a semiconductor structure is provided. In accordance with an embodiment of the present application, the semiconductor structure may include a compressive strained silicon germanium alloy fin having a first germanium content and located on a first portion of a substrate. A tensile strained silicon germanium alloy fin having a second germanium content that is less than the first germanium content is located on a second portion of the substrate.

DETAILED DESCRIPTION

Figure 1:
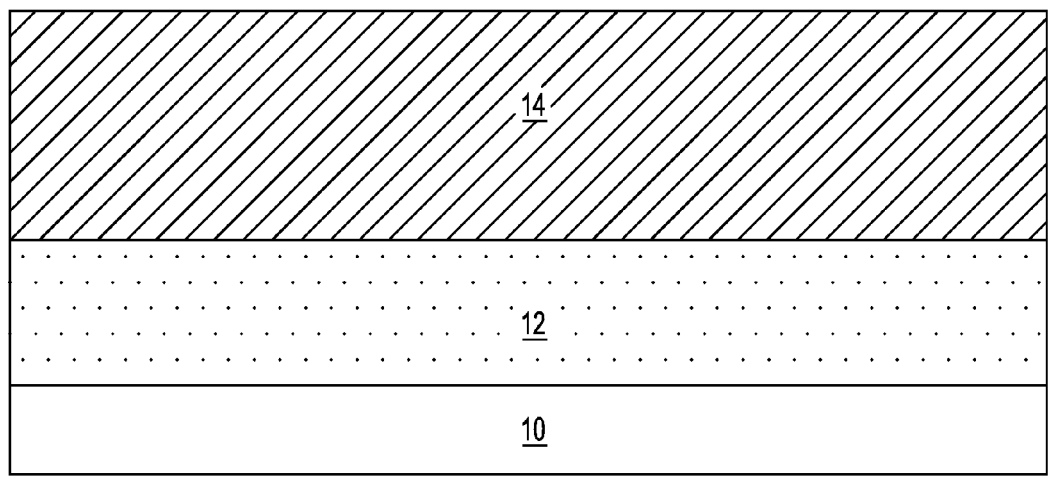
FIG. 1 is a cross sectional view of an exemplary semiconductor structure including, from bottom to top, a handle substrate, an insulator layer, and a silicon germanium alloy layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIG. 1, there is illustrated an exemplary semiconductor structure including, from bottom to top, a handle substrate 10, an insulator layer 12, and a silicon germanium alloy layer 14 that can be employed in accordance with an embodiment of the present application.

In some embodiments of the present application, the handle substrate 10 may comprise a semiconductor material. The term "semiconductor" as used herein in connection with the semiconductor material of the handle substrate 10 (or any other semiconductor material described herein) denotes any material that exhibits semiconductor properties including, for example, Si, Ge, SiGe, SiC, SiGeC, a II/VI compound semiconductor or a III/V compound semiconductor such as, for example, InAs, GaAs, or InP. In one embodiment, the handle substrate 10 is comprised of silicon. In some embodiments, the handle substrate 10 is a non-semiconductor material including, for example, a dielectric material and/or a conductive material. In yet other embodiments, the handle substrate 10 can be omitted and a substrate including insulator layer 12 and silicon germanium alloy layer 14 can be used in the present application.

In some embodiments, the handle substrate 10 and the silicon germanium alloy layer 14 may have a same crystal orientation. In other embodiments, the handle substrate 10 and the silicon germanium alloy layer 14 may have different crystal orientations. The crystal orientation of the handle substrate 10 and/or the silicon germanium alloy layer 14 may be {100}, {110}, or {111}. Other crystallographic orientations besides those specifically mentioned can also be used in the present application. The handle substrate 10 may be a single crystalline semiconductor material, a polycrystalline material, or an amorphous material. The silicon germanium alloy layer 14 is typically single crystalline. In some embodiments (not shown), the silicon germanium alloy layer 14 that is located atop the insulator layer 12 can be processed to include semiconductor regions having different crystal orientations.

The insulator layer 12 of the exemplary semiconductor structure shown in FIG. 1 may be a crystalline or non-crystalline oxide and/or nitride. In one embodiment, the insulator layer 12 is an oxide such as, for example, silicon dioxide. In another embodiment, the insulator layer 12 is a nitride such as, for example, silicon nitride or boron nitride. In yet still another embodiment of the present application, the insulator layer 12 may be a multilayered structure such as a stack of, in any order, silicon dioxide and boron nitride.

Silicon germanium alloy layer 14 that can be employed in the present application is a relaxed silicon germanium alloy. The term "relaxed silicon germanium alloy" is used throughout the present application to denote a silicon germanium alloy material that has a relaxation value of 90% or greater. In one embodiment of the present application, the silicon germanium alloy layer 14 can have an initial germanium content of from 25 atomic percent to 75 atomic percent (i.e., $Si_{1-y}Ge_y$, wherein y is from 0.25 to 0.75). Typically, the silicon germanium alloy layer 14 can have an initial germanium content from 35 atomic percent to 65 atomic percent. More typically, the silicon germanium alloy layer 14 can have an initial germanium content from 40 atomic percent to 60 atomic percent. The silicon germanium alloy layer 14 may be compositional graded or compositional ungraded.

The silicon germanium alloy layer 14 can be formed utilizing any well known deposition process including, for example, rapid thermal chemical vapor deposition (RTCVD), low-energy plasma deposition (LEPD), ultra-high vacuum chemical vapor deposition (UHVCVD), atomic pressure chemical vapor deposition (APCVD) or molecular beam epitaxy (MBE). A number of different source gases may be used for the deposition of silicon germanium alloy layer 14. In some embodiments, the source gas for the deposition of the silicon germanium alloy layer 14 includes a mixture of a silicon containing gas source and a germanium containing gas source or a combined silicon and germanium source gas may be used. Carrier gases like hydrogen, nitrogen, helium and argon can be used.

The exemplary semiconductor structure including the handle substrate 10, insulator layer 12, and the silicon germanium alloy layer 14 may be formed utilizing standard processes known in the art. In one example, the exemplary semiconductor structure shown in FIG. 1 may be formed by a layer transfer process in which wafer bonding may be used to provide the exemplary semiconductor structure shown in FIG. 1. In other embodiments, the exemplary semiconductor structure shown in FIG. 1 can be formed by thermal mixing of a silicon containing layer and a germanium containing layer that are formed over an insulator layer.

The thickness of the silicon germanium alloy layer 14 that can be formed in the present application is at or below the critical thickness of a silicon germanium alloy. Above the critical thickness the silicon germanium alloy that is formed is very defective and is not suitable for use as a device channel material. In one example, the thickness of the silicon germanium alloy layer 14 is from 30 nm to 100 nm. Other thicknesses that are lesser than, or greater than, the aforementioned thickness range can also be employed in the present application as long as the thickness is below the limit in which defects form and as long as the resultant silicon germanium alloy layer 14 is in a relaxed state.

The thickness of the insulator layer 12 that may be used in the present application can be from 10 nm to 200 nm. Other thicknesses that are lesser than, or greater than, the aforementioned thickness range for the insulator layer 12 can also be used in the present application. The thickness of the handle substrate 10 of the exemplary semiconductor structure shown in FIG. 1 is inconsequential to the present application.

Figure 2:
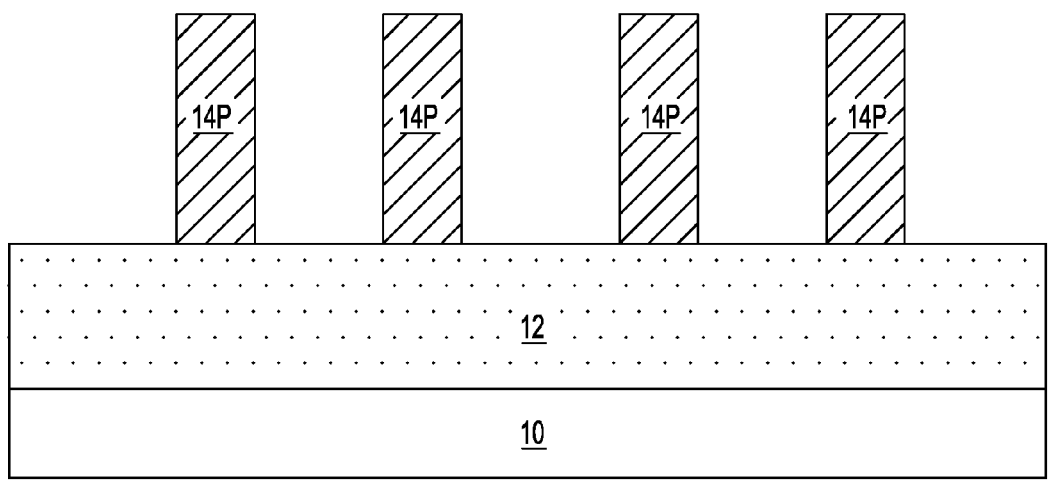
FIG. 2 is a cross sectional view of the exemplary semiconductor structure of FIG. 1 after patterning the silicon germanium alloy layer to provide a plurality of silicon germanium alloy fins extending upwards from the insulator layer.

Referring now to FIG. 2, there is illustrated the exemplary semiconductor structure of FIG. 1 after patterning the silicon germanium alloy layer 14 to provide a plurality of silicon germanium alloy fins 14P extending upwards from the insulator layer 12. Each silicon germanium alloy fin 14P that is formed has the initial germanium content mentioned above for silicon germanium alloy layer 14.

In one embodiment of the present application, the patterning process comprises a sidewall image transfer (SIT) process. The SIT process includes forming a contiguous mandrel material layer (not shown) over the silicon germanium alloy layer 14. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers through the silicon germanium alloy layer 14 and stopping on the insulator layer 12. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

In another embodiment, the patterning process can include lithography and etching. Lithography includes forming a photoresist material (not shown) over the silicon germanium alloy layer 14. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing.

In any of the patterning processed mentioned above, a hard mask layer such as, for example, silicon dioxide and/or silicon nitride, may be formed on the topmost surface of the silicon germanium alloy layer 14 prior to patterning. After patterning, a remaining portion of the hard mask layer is present atop each silicon germanium alloy fin 14P. The portion of the hard mask layer that remains after patterning can be referred to herein as hard mask cap (not shown). The hard mask cap can be removed after patterning by a planarization process such as, for example, chemical mechanical planarization and/or grinding.

Each silicon germanium alloy fin 14P that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each silicon germanium alloy fin 14P that is formed has a height from 10 nm to 100 nm, and a width from 5 nm to 30 nm. Other heights and widths that are lesser than, or greater than, the aforementioned ranges may also be used in the present application for each silicon germanium alloy fin 14P. Each silicon germanium alloy fin 14P is separated from its nearest neighboring silicon germanium alloy fin 14P by a pitch that is from 20 nm to 60 nm; the pitch can be measured from a central portion of one silicon germanium alloy fin 14P to a central portion of the nearest neighboring silicon germanium alloy fin 14P. Each silicon germanium alloy fin 14P includes the germanium content mentioned above for the silicon germanium alloy layer 14. Each silicon germanium alloy fin 14P extends upwards from a surface of insulator layer 12.

Figure 3:
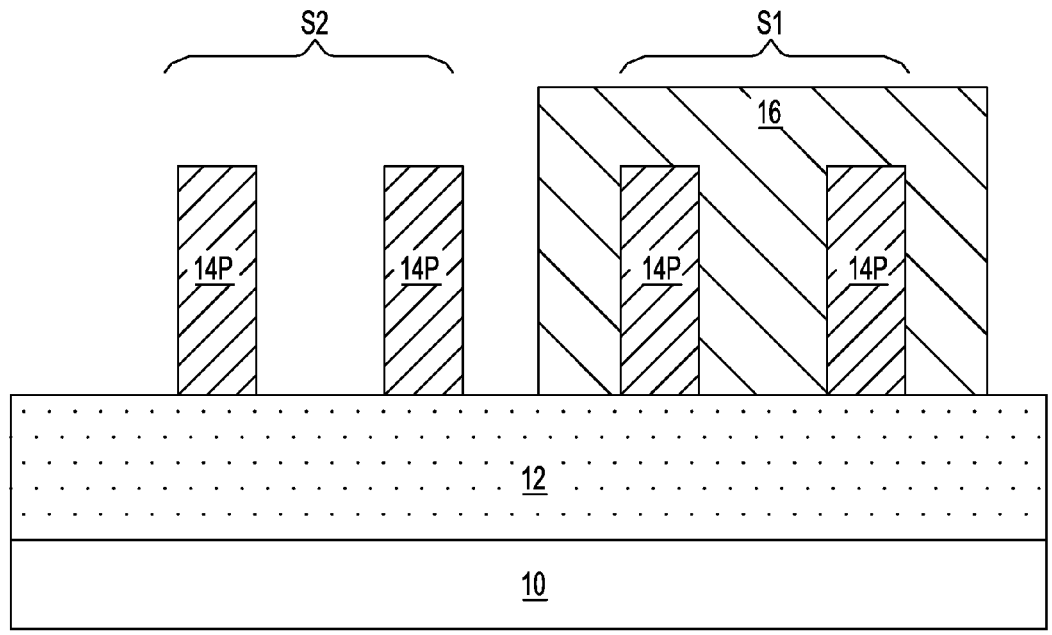
FIG. 3 is a cross sectional view of the exemplary semiconductor structure of FIG. 2 after forming a block mask over a first set of the silicon germanium alloy fins.

Referring now to FIG. 3, there is illustrated the exemplary semiconductor structure of FIG. 2 after forming a block mask 16 (i.e., first block mask) over a first set, S1, of the silicon germanium alloy fins 14P. The block mask 16 does not cover a second set, S2, of the silicon germanium alloy fins 14P. Thus, the second set, S2, of the silicon germanium alloy fins 14P is exposed.

Block mask 16 that can be employed in the present application includes any material that can prevent deposition of one material on the protected set of the silicon germanium alloy fins. In one embodiment, the block mask 16 may be composed of only a photoresist material. In another embodiment, the block mask 16 may be composed of only a hard mask material. Examples of hard mask materials that can be used as block mask 16 include silicon dioxide, silicon nitride and/or silicon oxynitride. In another embodiment of the present application, the block mask 16 may comprise a stack of, from bottom to top, a hard mask material and a photoresist material.

The block mask 16 can be formed utilizing techniques that are well known to those skilled in the art. For example, the block mask 16 can be formed by first depositing at least one of the above mentioned materials and then patterning the at least one deposited material by lithography. An anisotropic etching process such as, for example, reactive ion etching can also be used to complete any pattern transfer that may be needed; for example, an anisotropic etch may be used to transfer a pattern from a lithographically defined photoresist into the underlying material that may define the block mask 16.

Figure 4A:
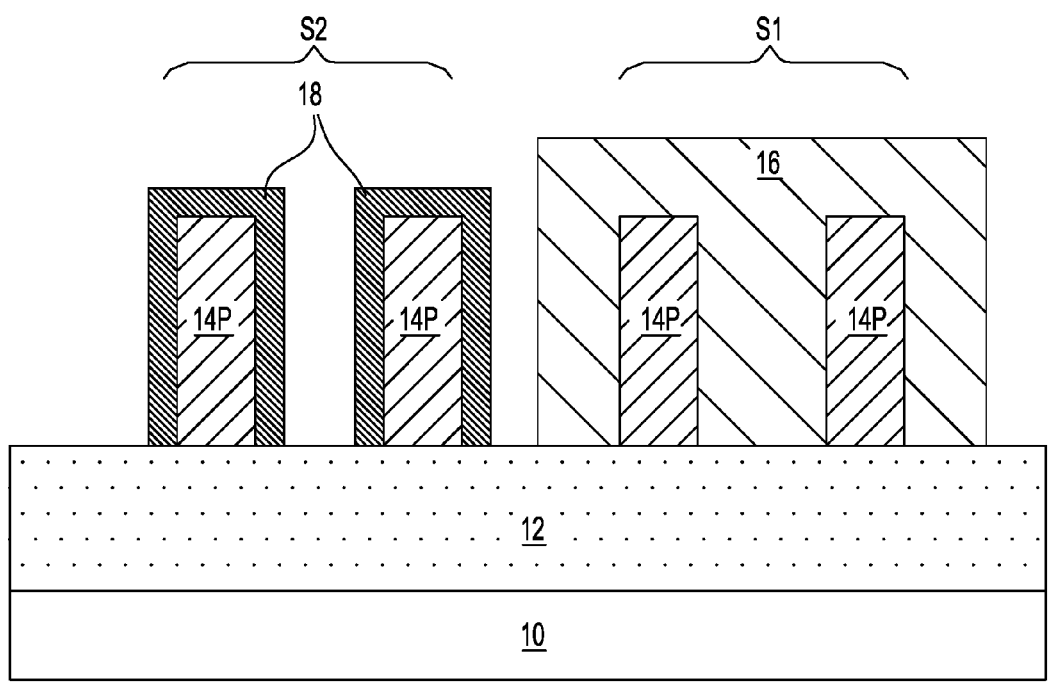
FIG. 4A is a cross sectional view of the exemplary semiconductor structure of FIG. 3 after forming a silicon layer on a second set of the silicon germanium alloy fins not including the block mask.

Referring now to FIG. 4A, there is illustrated the exemplary semiconductor structure of FIG. 3 after forming a silicon layer 18 on the second set, S2, of the silicon germanium alloy fins 14P not including the block mask 16. The silicon layer 18 forms a cladding of silicon around the exposed second set, S2, of the silicon germanium alloy fins 14P. Notably, the silicon layer 18 is formed on the sidewall surfaces and the topmost surface of each silicon germanium alloy fin 14P within the second set, S2. The silicon layer 18 is a conformal layer meaning that it has a thickness that is substantially the same (within±0.5 nm) everwhere along an interface with the second set, S2, of the silicon germanium alloy fins 14P. In one embodiment, the thickness of the silicon layer 14 is from 10 nm to 50 nm. Other thicknesses are possible and are not excluded from being used in the present application.

The silicon layer 18 can be formed by an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the silicon layer 18 has an epitaxial relationship, i.e., same crystal orientation, as that of the silicon germanium alloy fin 14P.

Examples of various epitaxial growth processes that are suitable for use in forming the silicon layer 18 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of the silicon layer 18. In some embodiments, the source gas for the deposition of the silicon layer 18 includes a silicon containing gas source such as, for example, a silane. Carrier gases like hydrogen, nitrogen, helium and argon can be used.

Figure 5:
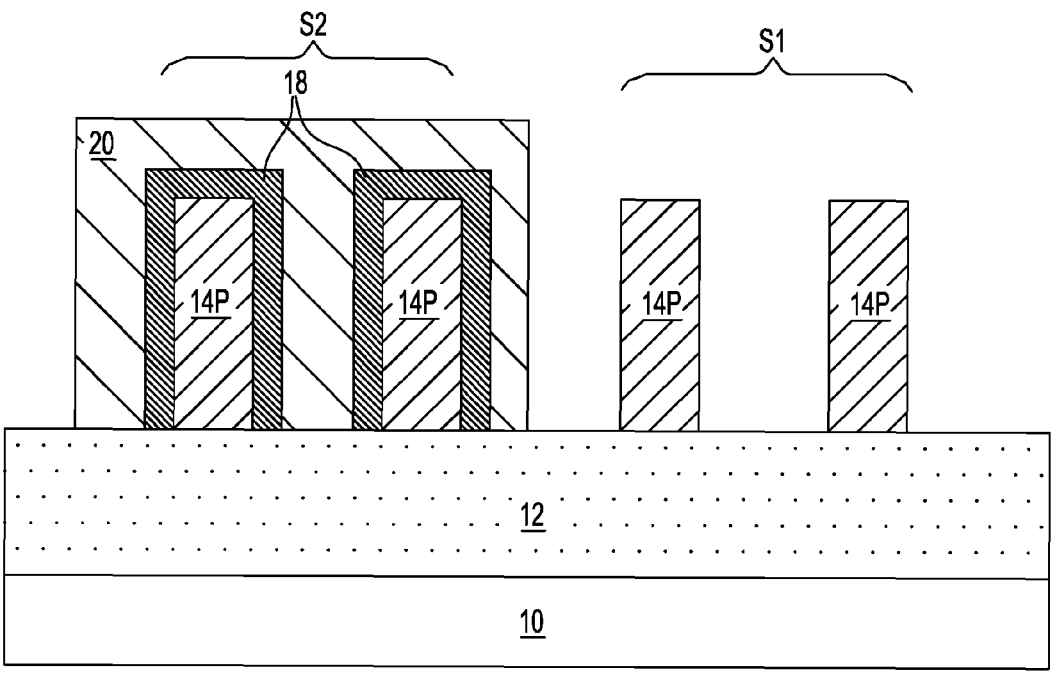
FIG. 5 is a cross sectional view of the exemplary semiconductor structure of FIG. 4A after removing the block mask, and forming another block mask over the second set of the silicon germanium alloy fins that contains the silicon layer.

Referring now to FIG. 5, there is illustrated the exemplary semiconductor structure of FIG. 4A after removing the block mask 16, and forming another block mask 20 (i.e., a second block mask) over the second set, S2, of the silicon germanium alloy fins 14P that contain the silicon layer 18. The first set, S1, of the silicon germanium alloy fins 14P are not covered by the another block mask 20.

Block mask 16 can be removed utilizing any conventional process that can selectively remove the material or materials that provide the block mask 16. In one embodiment, and when the block mask is composed of a remaining portion of a photoresist material, the remaining portion of the photoresist material can be removed utilizing a resist stripping process such as, for example, ashing. In another embodiment, and when the block mask 16 is composed of hard mask material, a planarization process such as, for example, chemical mechanical polishing (CMP) or grinding may be used. Alternatively, an etching process can be used to selectively remove the hard mask material. When the block mask 16 is comprised of a stack of, from bottom to top, a hard mask material and a photoresist material, the photoresist material can be removed first by utilizing a resist stripping process, and thereafter a planarization process or etching may be used to remove the hard mask material.

The another block mask 20 that is formed includes one of the block mask materials mentioned above for block mask 16. The another block mask 20 can be formed utilizing one of the techniques mentioned above for block mask 16.

Figure 6:
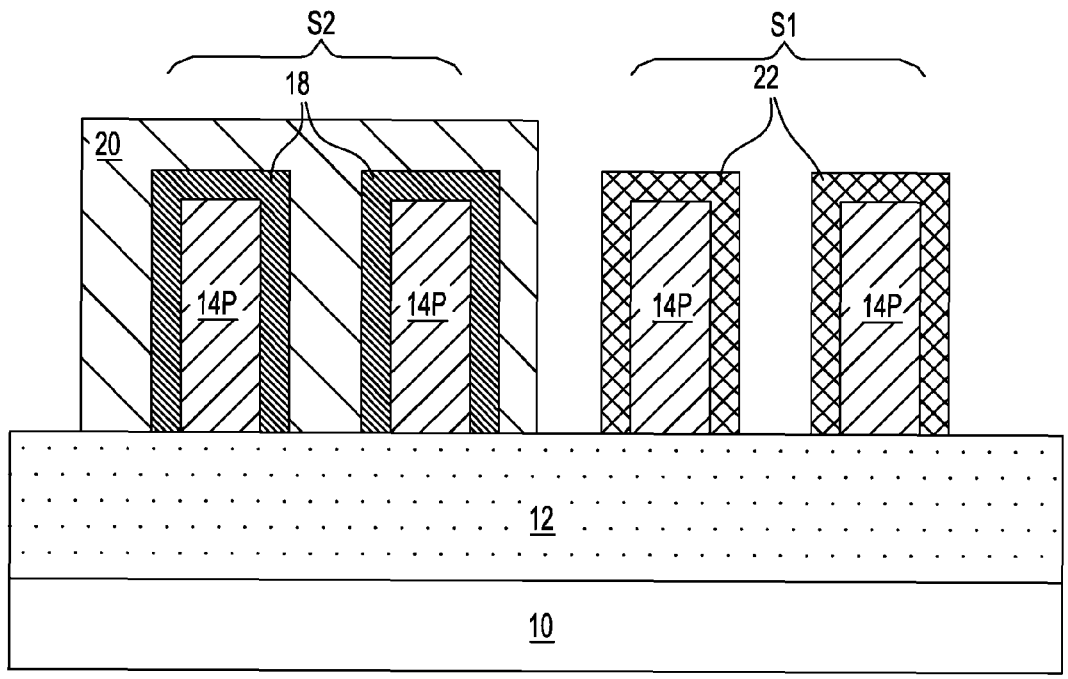
FIG. 6 is a cross sectional view of the exemplary semiconductor structure of FIG. 5 after forming a germanium containing layer on the first set of the silicon germanium alloy fins not including the another block mask.

Referring now to FIG. 6, there is illustrated the exemplary semiconductor structure of FIG. 5 after forming a germanium containing layer 22 on the first set, S1, of the silicon germanium alloy fins 14P not including the another block mask 20. The germanium containing layer 22 forms a cladding of a germanium containing material around the exposed first set, S1, of the silicon germanium alloy fins 14P. Notably, the germanium containing layer 22 is formed on the sidewall surfaces and the topmost surface of each silicon germanium alloy fin 14P within the first set, S1. The germanium containing layer 22 is a conformal layer meaning that it has a thickness that is substantially the same (within±0.5 nm) everywhere along an interface with the first set, S1, of the silicon germanium alloy fins 14P. In one embodiment, the thickness of the germanium containing layer 22 is from 10 nm to 50 nm. Other thicknesses are possible and are not excluded from being used in the present application.

As mentioned above, the germanium containing layer 22 includes a germanium containing material. By "germanium containing material" it is meant either pure germanium (100% pure geranium) or a silicon germanium alloy that contains from 75 atomic percent germanium up to 99.99 atomic percent germanium.

The germanium containing layer 22 can be formed by an epitaxial deposition or growth process as mentioned above for forming the silicon layer 18. Since an epitaxial deposition process is used, the germanium containing layer 22 has an epitaxial relationship, i.e. same crystal orientation, as that of the first set, S1, of the silicon germanium alloy fins 14P. The germanium containing layer 22 can be formed utilizing one of the precursors mentioned above in providing the silicon germanium alloy layer 14.

Figure 4B:
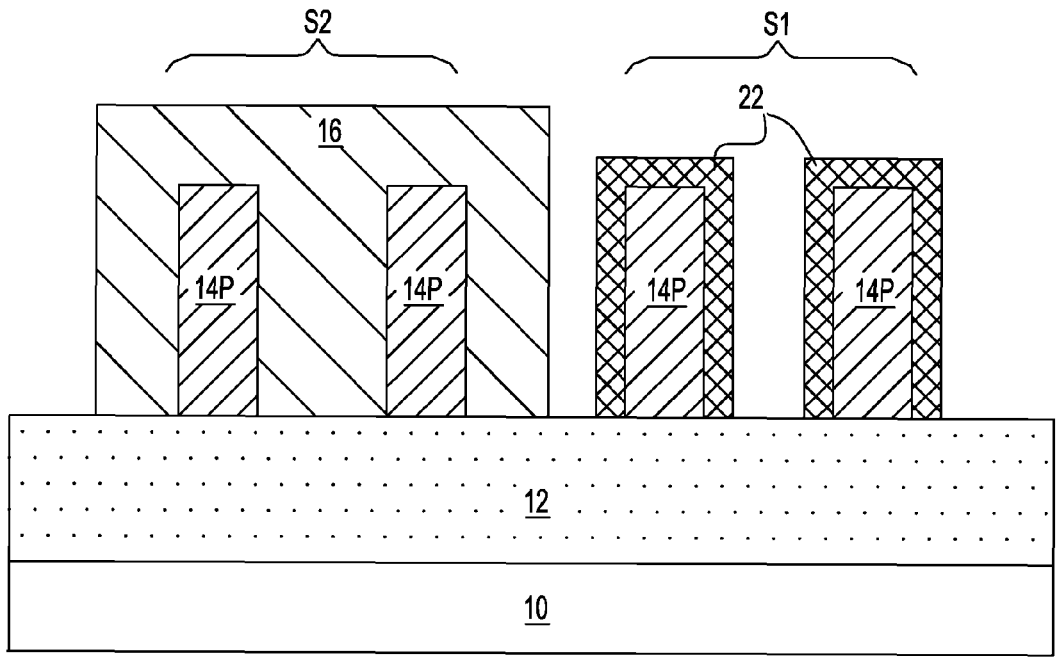
FIG. 4B is a cross sectional view, analogous to the semiconductor structure of FIG. 4A, after forming a germanium containing layer on a first set of the silicon germanium alloy fins not including the block mask.

Although the foregoing describes and illustrates cladding the second set, S2, of the silicon germanium alloy fins 14P with the silicon layer 18, prior to cladding the first set, S1, of the silicon germanium alloy fins 14P with the germanium containing layer 22, as seen with reference to FIG. 4B, the present application also works when cladding of the first set, S1, of the silicon germanium alloy fins 14P with the germanium containing layer 22 occurs prior to cladding the second set, S2, of the silicon germanium alloy fins 14P with the silicon layer 18. Thus, the cladding of the first set, S1, of the silicon germanium alloy fins 14P and the cladding of the second set, S2, of the silicon germanium alloy fins can be performed in any order.

Figure 7:
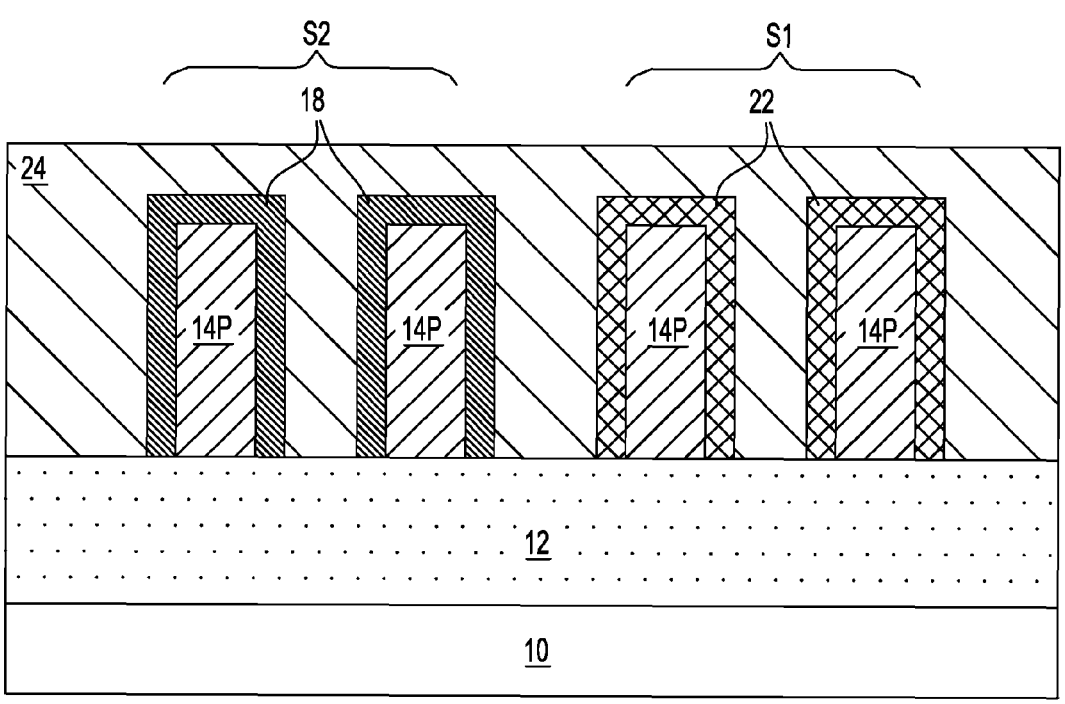
FIG. 7 is a cross sectional view of the exemplary semiconductor structure of FIG. 6 after removing the another block mask and forming a yet further block mask over the first set of the silicon germanium alloy fins containing the germanium containing layer and the second set of the silicon germanium alloy fins containing the silicon layer.

Referring now to FIG. 7, there is illustrated the exemplary semiconductor structure of FIG. 6 after removing the another block mask 20 and forming a yet further block mask 24 (i.e., a third block mask) over the first set, S1, of the silicon germanium alloy fins 14P containing the germanium containing layer 22 and the second set, S2, of the silicon germanium alloy fins 14P containing the silicon layer 18.

The another block mask 22 can be removed utilizing any conventional process including those mentioned above in removing block mask 16. The yet further block mask 24 that is formed includes one of the block mask materials mentioned above for block mask 16. The yet further block mask 24 can be formed utilizing one of the techniques mentioned above for block mask 16.

Figure 8:
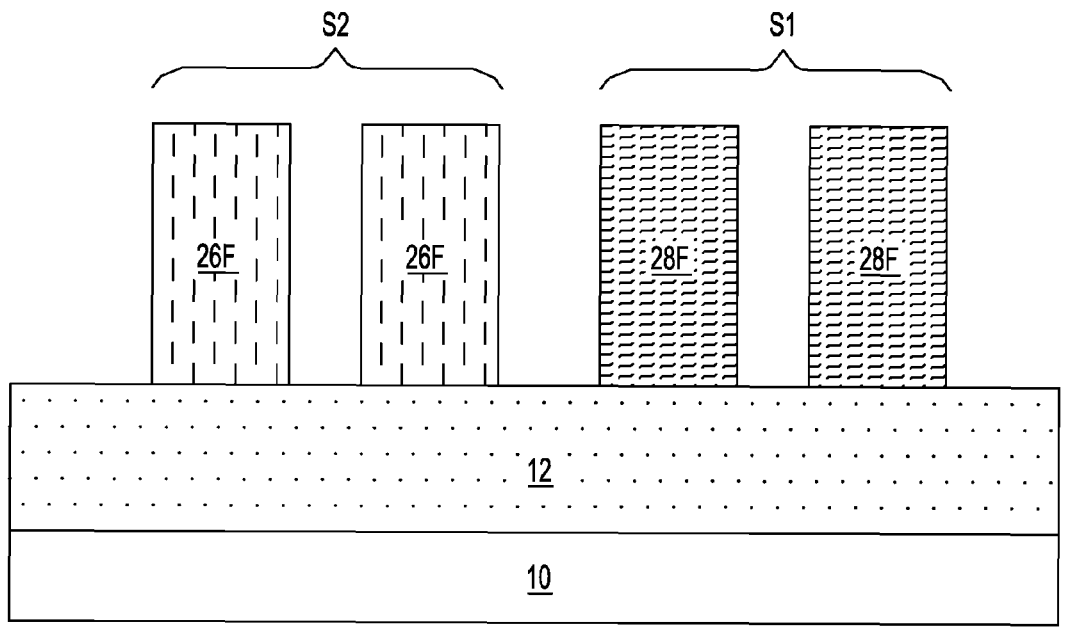
FIG. 8 is a cross sectional view of the exemplary semiconductor structure of FIG. 7 after converting the first set of the silicon germanium alloy fins containing the germanium containing layer into compressive strained silicon germanium alloy fins having a first germanium content and the second set of the silicon germanium alloy fins containing the silicon layer into tensile strained silicon germanium alloy fins having a second germanium content that is less than the first germanium content.

Referring now to FIG. 8, there is illustrated the exemplary semiconductor structure of FIG. 7 after converting the first set, S1, of the silicon germanium alloy fins 14P containing the germanium containing layer 22 into compressive strained silicon germanium alloy fins 28F having a first germanium content and the second set, S2, of the silicon germanium alloy fins 14P containing the silicon layer 18 into tensile strained silicon germanium alloy fins 26F having a second germanium content that is less than the first germanium content. The converting mentioned above occurs at the same time, i.e., simultaneously, and is performed utilizing a thermal anneal.

During the thermal anneal, the germanium atoms of the second set, S2, of the silicon germanium alloy fins 14P diffuse outward and into the silicon layer 18. As a result of this diffusion, the original germanium content of the second set, S2, of the silicon germanium alloy fins 14P is diminished and the silicon layer is converted into a silicon germanium alloy. Also, and during the same thermal anneal, the germanium atoms from the germanium containing layer 22 diffuse inward and into the first set, S1, of the silicon germanium alloy fins 14P. As a result of this diffusion, the original germanium content of the first set, S1, of the silicon germanium alloy fins 14P is increased.

As mentioned above, the converting the first set, S1, of the silicon germanium alloy fins 14P containing the germanium containing layer 22 into compressive strained silicon germanium alloy fins 28F and the second set, S2, of the silicon germanium alloy fins 14P containing the silicon layer 18 into tensile strained silicon germanium alloy fins 26F can be performed utilizing a thermal anneal. In some embodiments, the thermal anneal may be performed without the presence of the yet further block mask 24.

The thermal anneal that can be used in the present application can be carried out in an inert ambient such as, for example, He, Ar and/or Ne. The thermal anneal can be performed at a temperature from 800° C. to 1350° C. The thermal anneal may include a furnace anneal, a rapid thermal anneal or any other anneal that can provide the exemplary semiconductor structure shown in FIG. 8.

As is shown in FIG. 8, a topmost surface of each compressive strained silicon germanium alloy fin 28F is coplanar with a topmost surface of each tensile strained silicon germanium alloy fin 26F, and a bottommost surface of each compressive strained silicon germanium alloy fin 28F is coplanar with a bottommost surface of each tensile strained silicon germanium alloy fin 26F. Thus, each compressive strained silicon germanium alloy fin 28F and each tensile strained silicon alloy fin 26F are of the same height and are located on a same substrate, i.e., insulator layer 12. In some embodiments, the height of each compressive strained silicon germanium alloy fin 28F and each tensile strained silicon germanium alloy fin 26F can be different. In some embodiments, and as shown, a width of each compressive strained silicon germanium alloy fin 28F is the same as a width of each tensile strained silicon germanium alloy fin 26F. In other embodiments, each compressive strained silicon germanium alloy fin 28F has a different width than each tensile strained silicon germanium alloy fin 26F.

Each compressive strained silicon germanium alloy fin 28F is a thermally mixed reaction product of one of the silicon germanium alloy fins 14P of the first set, S1, of the silicon germanium alloy fins 14P and the germanium containing layer 22. As mentioned above, each compressive strained silicon germanium alloy fin 28F has a first germanium content. The first germanium content of each compressive strained silicon germanium alloy fin 28F is greater than the second germanium content of each tensile strained silicon germanium alloy fin 26F. In one example, the first germanium content of each compressive strained silicon germanium alloy fin 28F is from 50 atomic percent to 80 atomic percent. In another example, the first germanium content of each compressive strained silicon germanium alloy fin 28F is from 60 atomic percent to 75 atomic percent.

Each tensile strained silicon germanium alloy fin 26F is a thermally mixed reaction product of one of the silicon germanium alloy fins 14P of the second set, S2, of the silicon germanium alloy fins 14P and the silicon layer 18. As mentioned above, each tensile strained silicon germanium alloy fin 26F has a second germanium content. The second germanium content of each tensile strained silicon germanium alloy fin 26F is less than the first germanium content of each compressive strained silicon germanium alloy fin 28F. In one example, the second germanium content of each tensile strained silicon germanium alloy fin 26F is from 20 atomic percent to 50 atomic percent. In another example, the second germanium content of each tensile strained silicon germanium alloy fin 26F is from 25 atomic percent to 35 atomic percent.

A portion of each compressive strained silicon germanium alloy 28F may be used as a p-channel of a pFET device, while a portion of each tensile strained silicon germanium alloy fin 26F can be used as an n-channel of an nFET device.

Figure 9:
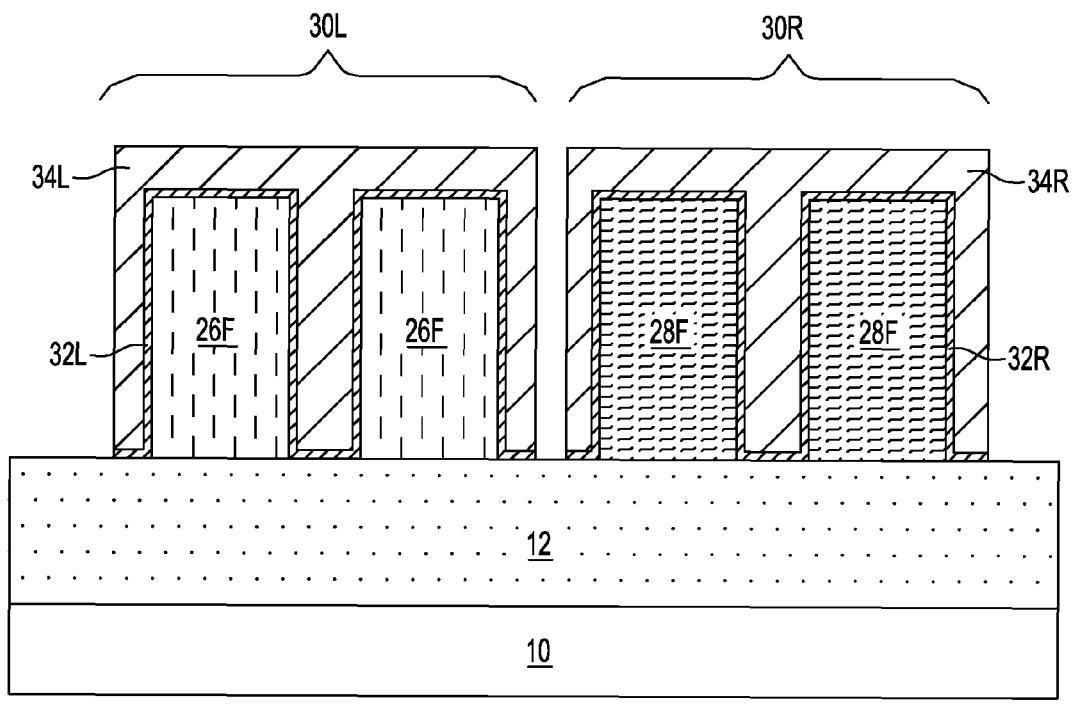
FIG. 9 is a cross sectional view of the exemplary semiconductor structure of FIG. 8 after forming a first functional gate structure straddling each compressive strained silicon germanium alloy fin, and a second functional gate structure straddling each tensile strained silicon germanium alloy fin.

Referring now to FIG. 9, there is illustrated the exemplary semiconductor structure of FIG. 8 after forming a first functional gate structure 30R straddling each compressive strained silicon germanium alloy fin 28F, and a second functional gate structure 30L straddling each tensile strained silicon germanium alloy fin 26F.

Although the present application describes and illustrates the formation of a single first functional gate structure 30R and a single second functional gate structure 30L, a plurality of first and/or second gate structures can be formed. The term "straddling" denotes that the functional gate structure 30R spans over each compressive strained silicon germanium alloy fin 28F, while the second functional gate structure 30L spans over each tensile strained silicon germanium alloy fin 26F. Portions of the first functional gate structure 30R contact sidewall surfaces and a topmost surface of each compressive strained silicon germanium alloy fin 28F, while portions of the second functional gate structure 30L contact sidewall surfaces and a topmost surface of each tensile stained silicon germanium alloy fin 26F. Other portions of the first and second functional gate structures (30L, 30R) also contact a topmost surface of the insulator layer 12.

By "functional gate structure" it is meant a permanent gate structure used to control output current (i.e., flow of carriers in the channel) of a semiconducting device through electrical or magnetic fields. Each functional gate structure (30L, 30R) that is formed includes a gate material stack of, from bottom to top, a gate dielectric portion (32L, 32R) and a gate conductor portion (34L, 34R). In some embodiments, a gate cap portion (not shown) can be present atop the gate conductor portion (34L, 34R).

The gate dielectric portion (32L, 32R) comprises a gate dielectric material. The gate dielectric material that provides the gate dielectric portion (32L, 32R) can be an oxide, nitride, and/or oxynitride. In one example, the gate dielectric material that provides the gate dielectric portion (32L, 32R) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the gate dielectric portion (32L, 32R).

The gate dielectric material used in providing the gate dielectric portion (32L, 32R) can be formed by any deposition process including, for example, chemical vapor deposition (CVD), plasma enhanced chemical vapor deposition (PECVD), physical vapor deposition (PVD), sputtering, or atomic layer deposition. In some embodiments, gate dielectric portion 32L comprises a same gate dielectric material as gate dielectric portion 32R. In other embodiments, gate dielectric portion 32L may comprise a different gate dielectric material than gate dielectric portion 32R. When a different gate dielectric material is used for the gate dielectric portions, block mask technology can be used. In one embodiment of the present application, the gate dielectric material used in providing the gate dielectric portion (32L, 32R) can have a thickness in a range from 1 nm to 10 nm. Other thicknesses that are lesser than, or greater than, the aforementioned thickness range can also be employed for the gate dielectric material.

The gate conductor portion (34L, 34R) comprises a gate conductor material. The gate conductor material used in providing the gate conductor portion (34L, 34R) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. Gate conductor portion 34L may comprise a same gate conductor material as, or a different gate conductor material from gate conductor portion 34R. In some embodiments, gate conductor portion 34L may comprise an nFET gate metal, while gate conductor portion 34R may comprise a pFET gate metal.

The gate conductor material used in providing the gate conductor portion (34L, 34R) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions (34L, 34R), block mask technology can be used. In one embodiment, the gate conductor material used in providing the gate conductor portion (34L, 34R) has a thickness from 1 nm to 100 nm. Other thicknesses that are lesser than, or greater than, the aforementioned thickness range can also be employed for the gate conductor material used in providing the gate conductor portion (34L, 34R).

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure (30L, 30R) can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, first and second sacrificial gate structures are first provided instead of the first and second functional gate structures described above. In another embodiment, at least one functional gate structure can be first provided straddling one of the sets of fins (e.g., fins 26F), and at least one sacrificial gate structure can formed straddling another of the sets of the fins (e.g., fins 28F).

By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional and/or sacrificial gate structure) source/drain regions (not shown) can be formed utilizing an epitaxial growth process from exposed portions of each of the silicon germanium alloy fins (26F, 28F) that are not protected by the gate structure; the source/drain regions would by located within a plane that runs into and out of the drawing illustrated in FIG. 9. The source/drain regions comprise any semiconductor material including, for example, Si, Ge or silicon germanium alloys. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure (functional gate structure and/or sacrificial gate structure). The gate spacer can be formed by deposition of a gate spacer material, such as, for example, a dielectric oxide, and then etching the deposited gate spacer material by utilizing a spacer etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims

What is claimed is:

1. A method of forming a semiconductor structure, said method comprising:
    providing a plurality of silicon germanium alloy fins extending upwards from a surface of a substrate;
    forming, in any order, a germanium containing layer contacting exposed surfaces of each silicon germanium alloy fin of a first set of said silicon germanium alloy fins, and a silicon layer contacting exposed surfaces of each silicon germanium alloy fin of a second set of said silicon germanium alloy fins; and
    converting, at the same time and utilizing a thermal anneal process, an entirety of each silicon germanium alloy fin of said first set of said silicon germanium alloy fins and said germanium containing layer into a compressive strained silicon germanium alloy fin having a first germanium content, and an entirety of each silicon germanium alloy fin of said second set of said silicon germanium alloy fins and said silicon layer into a tensile strained silicon germanium alloy fin having a second germanium content that is less than said first germanium content.

2. The method of claim 1, wherein said providing said plurality of silicon germanium alloy fins comprises:
    providing a semiconductor structure including, from bottom to top, a handle substrate, an insulator layer and a silicon germanium alloy layer that is 90 percent or greater relaxed and has an initial germanium content of from 25 atomic percent to 75 atomic percent; and
    patterning said silicon germanium alloy layer to provide said plurality of silicon germanium alloy fins.

3. The method of claim 1, wherein said germanium containing layer comprises pure germanium.

4. The method of claim 1, wherein said germanium containing layer comprises a silicon germanium alloy containing from 75 atomic percent germanium to 99.99 atomic percent germanium.

5. The method of claim 1, wherein said forming said silicon layer and said germanium containing layer comprise separate epitaxial growth processes.

6. The method of claim 1, wherein said thermal anneal process is performed in an inert ambient and at a temperature from 800° C. to 1350° C.

7. The method of claim 1, wherein said first germanium content is from 50 atomic percent to 80 atomic percent, and said second germanium content is from 20 atomic percent to 50 atomic percent.

8. The method of claim 1, wherein a topmost surface of each compressive strained silicon germanium alloy fin is coplanar with a topmost surface of each tensile strained silicon germanium alloy fin, and said bottommost surface of each compressive strained silicon germanium alloy fin is coplanar with a bottommost surface of each tensile strained silicon germanium alloy fin.

9. The method of claim 1, wherein said germanium containing layer is formed prior to said silicon layer, and a block mask is formed over said second set of said silicon germanium alloy fins during said forming said germanium containing layer.

10. The method of claim 1, wherein each compressive strained silicon germanium alloy fin is a thermally mixed reaction product of one of said silicon germanium alloy fins of said first set of said silicon germanium fins and said germanium containing layer and each tensile strained silicon germanium alloy fin is a thermally reaction product of one of said second set of said silicon germanium alloy fins and said silicon layer.

11. The method of claim 1, wherein said substrate is an insulator layer.

12. The method of claim 1, further comprising forming a first functional gate structure straddling each compressive strained silicon germanium alloy fin, and a second functional gate structure straddling each tensile strained silicon germanium alloy fin.

13. The method of claim 2, where said patterning comprises a sidewall image transfer process.

14. The method of claim 6, wherein said thermal anneal process is performed in the presence of a block mask located over said first set of said silicon germanium alloy fins containing said germanium containing layer and said second set of the silicon germanium alloy fins containing said silicon layer.

* * * * *